United States Patent
Anzue et al.

(10) Patent No.: US 8,222,670 B2
(45) Date of Patent: *Jul. 17, 2012

(54) SEMICONDUCTOR LIGHT EMITTING ELEMENT AND METHOD FOR MANUFACTURING SAME

(75) Inventors: Naomi Anzue, Hyogo (JP); Gaku Sugahara, Nara (JP); Yoshiaki Hasegawa, Shiga (JP); Akihiko Ishibashi, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/109,213

(22) Filed: May 17, 2011

(65) Prior Publication Data

US 2011/0215340 A1 Sep. 8, 2011

Related U.S. Application Data

(63) Continuation of application No. 12/375,118, filed as application No. PCT/JP2007/064004 on Jul. 13, 2007, now Pat. No. 8,030,677.

(30) Foreign Application Priority Data

Jul. 31, 2006 (JP) ................................. 2006-207527

(51) Int. Cl.
*H01L 33/00* (2010.01)
(52) U.S. Cl. ................................. 257/103; 257/E33.063
(58) Field of Classification Search .................... 257/99, 257/103, 77, E33.062, E33.063
See application file for complete search history.

(56) References Cited

U.S. PATENT DOCUMENTS

| 6,268,230 | B1 | 7/2001 | Kuniyasu | |
|---|---|---|---|---|
| 8,030,677 | B2* | 10/2011 | Anzue et al. | 257/99 |
| 2009/0294797 | A1 | 12/2009 | Anzue et al. | |
| 2011/0215340 | A1* | 9/2011 | Anzue et al. | 257/77 |

FOREIGN PATENT DOCUMENTS

| JP | 59-107589 | 6/1984 |
|---|---|---|
| JP | 5-67847 | 3/1993 |
| JP | 8-139408 | 5/1996 |
| JP | 11-340571 | 10/1999 |
| JP | 11-330614 | 11/1999 |
| JP | 2000-58972 | 2/2000 |

(Continued)

OTHER PUBLICATIONS

International Search Report for corresponding Application No. PCT/JP2007/064004 dated Jul. 30, 2007.

(Continued)

*Primary Examiner* — Mark Prenty
(74) *Attorney, Agent, or Firm* — Renner, Otto, Boisselle & Sklar, LLP

(57) ABSTRACT

A semiconductor light-emitting device according to the present invention includes: a GaN substrate 1 containing an n-type impurity and being made of silicon carbide or a nitride semiconductor; a multilayer structure 10 provided on a main surface of the GaN substrate 1; a p-electrode 17 formed on the multilayer structure 10; a first n-electrode 18 substantially covering the entire rear surface of the GaN substrate 1; and a second n-electrode 20 provided on the first n-electrode 18 so as to expose at least a portion of the periphery of the first n-electrode 18.

4 Claims, 10 Drawing Sheets

FOREIGN PATENT DOCUMENTS

| | | |
|---|---|---|
| JP | 2000-124540 | 4/2000 |
| JP | 2000-332343 | 11/2000 |
| JP | 2001-176823 | 6/2001 |
| JP | 2001-298243 | 10/2001 |
| JP | 2002-26443 | 1/2002 |
| JP | 2005-045054 | 2/2005 |

OTHER PUBLICATIONS

PCT/ISA/237 and concise explanation for Application No. PCT/JP2007/064004 dated Jul. 30, 2007.

Co-pending U.S. Appl. No. 12/375,118, filed Jan. 26, 2009.

* cited by examiner

FIG.9
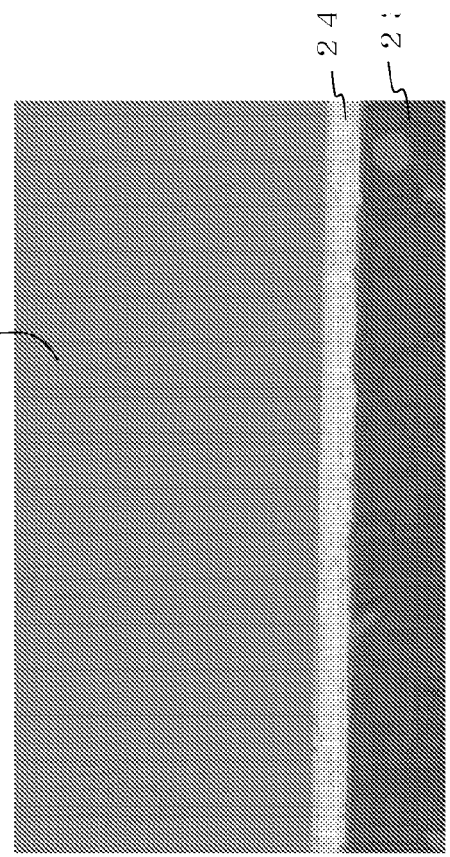
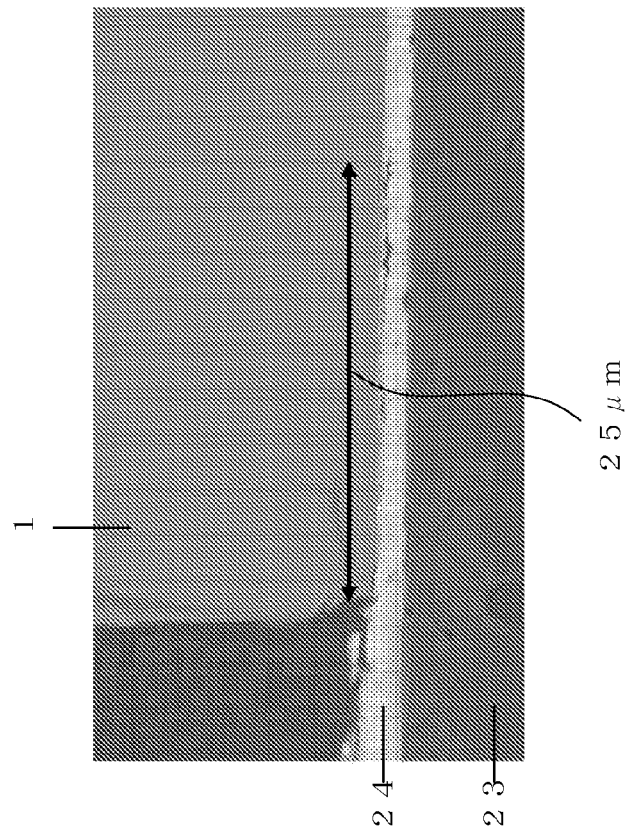

SEMICONDUCTOR LIGHT EMITTING ELEMENT AND METHOD FOR MANUFACTURING SAME

This application is a continuation application of U.S. patent application Ser. No. 12/375,118 filed on Jan. 26, 2009, now U.S. Pat. No. 8,030,677 which is a 371 of International Application No. PCT/JP2007/064004 filed on Jul. 13, 2007, which claims priority to Japanese Application No. 2006-207527 filed on Jul. 31, 2006, the contents of which are hereby incorporated by reference.

TECHNICAL FIELD

The present invention relates to a semiconductor light-emitting device and a production method thereof, and more particularly to a semiconductor light-emitting device which can be produced with a high yield and which has good optical characteristics, as well as a production method thereof.

BACKGROUND ART

A nitride semiconductor of the general formula $In_xGa_yAl_zN$ (where $x+y+z=1$, $0 \leq x \leq 1$, $0 \leq y \leq 1$, $0 \leq z \leq 1$) has a band gap corresponding to blue light and ultraviolet light depending on its composition, and is utilized as a semiconductor light-emitting device such as a light-emitting diode (LED) or a laser diode (LD).

A semiconductor light-emitting device made of a nitride semiconductor generally has a semiconductor multilayer structure composed of a nitride semiconductor, electrodes for supplying a current for an active region of the semiconductor multilayer structure, and a substrate for supporting the semiconductor multilayer structure and the electrodes. Since a semiconductor multilayer structure is formed through epitaxial growth of a semiconductor layer on a substrate, the crystal quality of the semiconductor multilayer structure strongly depends on the substrate.

In order to perform an epitaxial growth of a nitride semiconductor layer having an excellent crystallinity, it is desirable that the underlying substrate is made of a gallium nitride (GaN). However, conventionally, it has been difficult to produce a GaN substrate, and therefore substrates of sapphire ($Al_2O_3$), silicon carbide (SiC), or the like have been used as substitutes.

However, in recent years, quality GaN substrates having a low dislocation density are becoming available, and further longevity of semiconductor light-emitting devices is being expected. Since a GaN substrate also has an excellent electrical conductivity, a semiconductor light-emitting device construction has been proposed in which a p-electrode is provided on the main surface side of the substrate and an n-electrode is provided on the rear surface side. By adopting such a construction, it becomes possible to downsize the semiconductor light-emitting device as compared to a construction where both of the p-electrode and the n-electrode are provided on the substrate main surface side. Therefore, it becomes possible to obtain a greater number of semiconductor light-emitting devices from a single wafer.

Generally speaking, a semiconductor light-emitting device in which a GaN substrate is used is fabricated by forming electrodes on both surfaces of the substrate and thereafter cleaving the wafer. In Patent Document 1, a method of patterning the n-type electrode in advance for exposing the region to split in order to facilitate this cleavage is proposed.

Moreover, it is necessary for an n-electrode which is provided on the substrate rear surface side to form a good ohmic contact with the substrate and to adhere strongly to the substrate. In Patent Document 2, in order to satisfy such requirements, a semiconductor light-emitting device having an n-type electrode with a 3-layer structure is proposed.

In Patent Document 3, a method is proposed in which an edge scribing is performed from the p-type nitride semiconductor layer side and thereafter a cleavage is performed via breaking, in order to obtain a good cavity end face which is mirror-finished.

[Patent Document 1] Japanese Laid-Open Patent Publication No. 11-340571
[Patent Document 2] Japanese Laid-Open Patent Publication No. 2002-26443
[Patent Document 3] Japanese Laid-Open Patent Publication No. 2000-58972

DISCLOSURE OF INVENTION

Problems to be Solved by the Invention

In conventional production methods, a p-electrode is fabricated on the substrate main surface side, and after the substrate rear surface is polished until the thickness of the substrate reaches about 100 μm, an n-electrode is formed on the substrate rear surface. The reason for polishing the substrate rear surface is in order to facilitate a subsequent step of device separation via cleavage. However, a substrate which has become a thin film has a poor mechanical strength and is difficult to handle. Moreover, breaking and cracking are likely to occur. In particular, in the case where an n-electrode is formed only in a predetermined region of the substrate rear surface, as in the conventional technique disclosed in Patent Document 1, breaking and cracking may occur due to an impact when the substrate comes in contact with a reticle when a patterning is performed by photolithography technique or the like, whereby the yield will be significantly lowered.

On the other hand, as in the conventional technique disclosed in Patent Document 2, when an n-electrode is deposited on the entire substrate rear surface, the electrode pattern on the substrate main surface side can no longer be confirmed from the substrate rear surface side. Since a GaN substrate naturally has a light-transmitting ability, in a state where no n-electrode is formed on the substrate rear surface, it is possible to visually recognize, from the substrate rear surface side, the electrode pattern that is formed on the substrate main surface side. However, when an n-type electrode covers the entire substrate rear surface, it is no longer possible to observe from the substrate rear surface side the electrode pattern that is on the substrate main surface side. Therefore, according to the technique of Patent Document 2, it is difficult to determine cleavage positions from the substrate rear surface side in a device separation step. A starting position of a cleavage is defined by a scribe mark which is formed by scribing. If this scribe mark is deviated from the crystal orientation <11-20> or <1-100> in which cleave should occur, problems such as occurrence of cracks and destruction of the multilayer structure at the substrate main surface side will occur frequently.

In a method of forming a scribe mark on the substrate main surface side, as in the conventional technique disclosed in Patent Document 3, damage is likely to occur in the multilayer structure on the substrate main surface side, thus resulting in problems such as a lowered emission efficiency and a lowered yield. Although it might be possible to form a scribe mark only in the outer periphery of the wafer and effect cleavage by applying a stress with a blade, damage will occur in a few devices that are in the region where the scribe mark is formed, thus also resulting in a lowered yield.

Furthermore, when allowing a semiconductor light-emitting device to adhere to a heat sink, a pressure is applied while conducting heating via solder, and therefore crystal strain and cracking are likely to occur in the semiconductor layer, thus deteriorating the device characteristics and the yield.

Moreover, regardless of whether a scribe mark to serve as a beginning point of cleavage is formed at the main surface side or the rear surface side of the substrate, or whether the stress for effecting the cleavage is applied to the main surface side or the rear surface side of the substrate, if a metal having a high ductility such as Au is deposited at the cleavage positions, peeling or breaking of the n-electrode becomes likely to occur. As a result, problems may occur such as the barrier metal contacting with the semiconductor layer, or leakage, thus resulting in a lowered yield.

The present invention has been made in view of the aforementioned problems, and an objective thereof is to provide a semiconductor light-emitting device having good electrical characteristics and optical characteristics with a high yield.

Means for Solving the Problems

A semiconductor light-emitting device according to the present invention comprises: a semiconductor substrate containing an n-type impurity and being made of silicon carbide or a nitride semiconductor; an n-type semiconductor layer provided on a main surface of the semiconductor substrate; an active layer provided on the n-type semiconductor layer; a p-type semiconductor layer provided on the active layer; a p-electrode in contact with the p-type semiconductor layer; and an n-electrode in contact with a surface of the semiconductor substrate opposite from the main surface, wherein, the n-electrode includes a first n-electrode which substantially covers the entire surface of the semiconductor substrate opposite from the main surface and a second n-electrode provided on the first n-electrode so as to expose at least a portion of a periphery of the first n-electrode.

In a preferred embodiment, a portion of a side face of a multilayer structure constitutes a cavity end face, the multilayer structure including the n-type semiconductor layer, the active layer, and the p-type semiconductor layer; and the second n-electrode is provided so as to expose a portion of the periphery of the first n-electrode that extends along the cavity end face.

In a preferred embodiment, the first n-electrode comprises a material having a lower ductility than that of the second n-electrode.

In a preferred embodiment, the first n-electrode comprises at least one kind of metal selected from the group consisting of titanium (Ti), platinum (Pt), molybdenum (Mo), and nickel (Ni) or an alloy thereof, and the second n-electrode comprises at least one kind of metal selected from the group consisting of aluminum (Al), gold (Au), tin (Sn), indium (In), and nickel (Ni) or an alloy thereof.

In a preferred embodiment, the semiconductor substrate comprises gallium nitride.

A production method for a semiconductor light-emitting device according to the present invention comprises: step (a) of forming an n-type semiconductor layer, an active layer, and a p-type semiconductor layer in this order on a main surface of a semiconductor substrate which is made of silicon carbide or a nitride semiconductor; step (b) of forming, on the p-type semiconductor layer, a p-electrode which is in contact with the p-type semiconductor layer; step (c) of forming a first n-electrode which substantially covers an entire surface of the semiconductor substrate opposite from the main surface; step (d) of forming a second n-electrode on the first n-electrode; and step (e) of, after step (d), cleaving the semiconductor substrate, the n-type semiconductor layer, the active layer, and the p-type semiconductor layer along a cleavage direction, and splitting the first n-electrode, wherein, at step (d), the second n-electrode is formed so as to expose a portion of the first n-electrode that extends along the cleavage direction.

In a preferred embodiment, at step (d), the second n-electrode is formed so that the first n-electrode is exposed in a lattice form.

In a preferred embodiment, the first n-electrode is made of a material having a lower ductility than that of the second n-electrode.

In a preferred embodiment, the first n-electrode comprises at least one kind of metal selected from the group consisting of titanium (Ti), platinum (Pt), molybdenum (Mo), and nickel (Ni) or an alloy thereof, and the second n-electrode comprises at least one kind of metal selected from the group consisting of aluminum (Al), gold (Au), tin (Sn), indium (In), and nickel (Ni), or an alloy thereof.

In a preferred embodiment, the semiconductor substrate comprises gallium nitride.

Effects of the Invention

According to the present invention, since a first n-electrode is provided on the entire rear surface of a substrate, the mechanical strength of the entire wafer is improved, and chipping and cracking is unlikely to occur in subsequent steps, such that semiconductor devices can be produced with a high yield. Moreover, according to the present invention, a second n-electrode having a different planar shape from that of the first n-electrode is provided on the first n-electrode, it is easy to determine cleavage positions from the substrate rear surface side, whereby the yield in a device separation step is improved.

BRIEF DESCRIPTION OF DRAWINGS

FIGS. 9(a) and (b) are SEM photographs showing states of the neighborhood of an n-electrode after the semiconductor laser devices of Embodiments 1 to 3 are mounted.

DESCRIPTION OF THE REFERENCE NUMERALS

1 GaN substrate (wafer)
18 first n-electrode
20 second electrode

BEST MODE FOR CARRYING OUT THE INVENTION

Embodiment 1

Hereinafter, with reference to the drawings, a first embodiment of a semiconductor light-emitting device according to the present invention and a production method thereof will be described. The semiconductor light-emitting device of the present embodiment is a nitride semiconductor laser.

First, with reference to FIG. 1, a method of producing a multilayer structure in a nitride semiconductor laser will be described.

Figure 1:
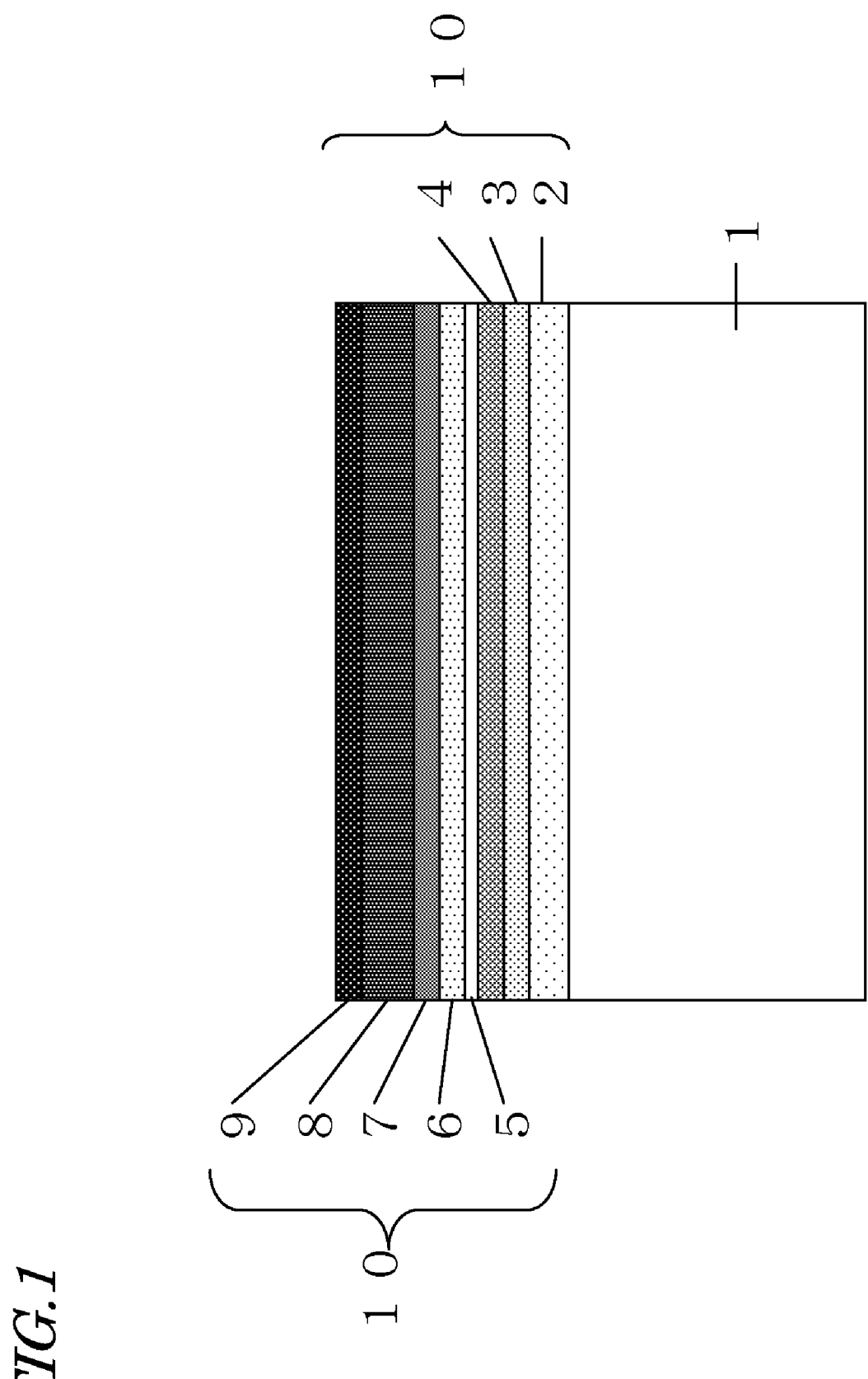
FIG. 1 is a schematic diagram showing a semiconductor multilayer structure according to Embodiment 1 of the present invention.

In the present embodiment, in order to obtain a multilayer structure 10 shown in FIG. 1, first, a GaN substrate (GaN wafer) 1 whose main surface is the (0001) plane and which contains an n-type impurity is provided, and is retained on a susceptor in a reactor of a metal-organic vapor phase epitaxy (MOVPE) apparatus. The reactor is heated to about 1000° C., and source gases of trimethylgallium (TMG) and ammonia ($NH_3$) gas and a carrier gas of hydrogen are simultaneously supplied, and silane ($SiH_4$) gas is supplied as an n-type dopant, thus allowing an n-type GaN layer 2 having a thickness of about 1 μm and an Si impurity concentration of about $1 \times 10^{18}$ $cm^{-3}$ to grow.

Next, trimethylaluminum (TMA) is added, and an n-type cladding layer 3 composed of n-type $Al_{0.05}Ga_{0.95}N$ with a thickness of about 1.5 μm and an Si impurity concentration of about $5 \times 10^{17}$ $cm^{-3}$ is grown.

Then, after growing a first optical guide layer 4 composed of n-type GaN with a film thickness of about 120 nm and an Si impurity concentration of about $1 \times 10^{18}$ $cm^{-3}$, the temperature is lowered to about 800° C., the carrier gas is changed from hydrogen to nitrogen, and trimethylindium (TMI) and TMG are supplied, thus growing a multi-quantum well active layer 5 including quantum wells (three layers) composed of $In_{0.1}Ga_{0.9}N$ with a film thickness of about 3 nm and $In_{0.02}Ga_{0.98}N$ barrier layers (two layers) with a film thickness of about 9 nm.

Next, the temperature within the reactor is again elevated to about 1000° C., the carrier gas is changed back from nitrogen to hydrogen, and while supplying a p-type dopant of biscyclopentadienylmagnesium ($Cp_2Mg$) gas, a capping layer 6 composed of p-type $Al_{0.15}Ga_{0.85}N$ with a film thickness of about 10 nm and an Mg impurity concentration of about $5 \times 10^{17}$ $cm^{-3}$ is grown.

Next, a second optical guide layer 7 composed of p-type GaN with a film thickness of about 120 nm and an Mg impurity concentration of about $1 \times 10^{18}$ $cm^{-3}$ is grown. Then, a p-type cladding layer 8 composed of p-type $Al_{0.05}Ga_{0.95}N$ with a film thickness of about 0.5 μm and an impurity concentration of about $5 \times 10^{17}$ $cm^{-3}$ is grown.

Finally, a p-type contact layer 9 composed of p-type GaN with a film thickness of about 0.1 μm and an Mg impurity concentration of about $1 \times 10^{18}$ $cm^{-3}$ is grown.

Hereinafter, with reference to FIGS. 2(a) to (i), a processing process on the main surface side of the GaN substrate 1, i.e., a processing process for producing a semiconductor laser structure from the semiconductor multilayer structure 10, will be described. Note that FIGS. 2(a) to (i) show cross sections along the (1-100) plane of the GaN substrate 1 and the semiconductor multilayer structure 10.

Figure 2:
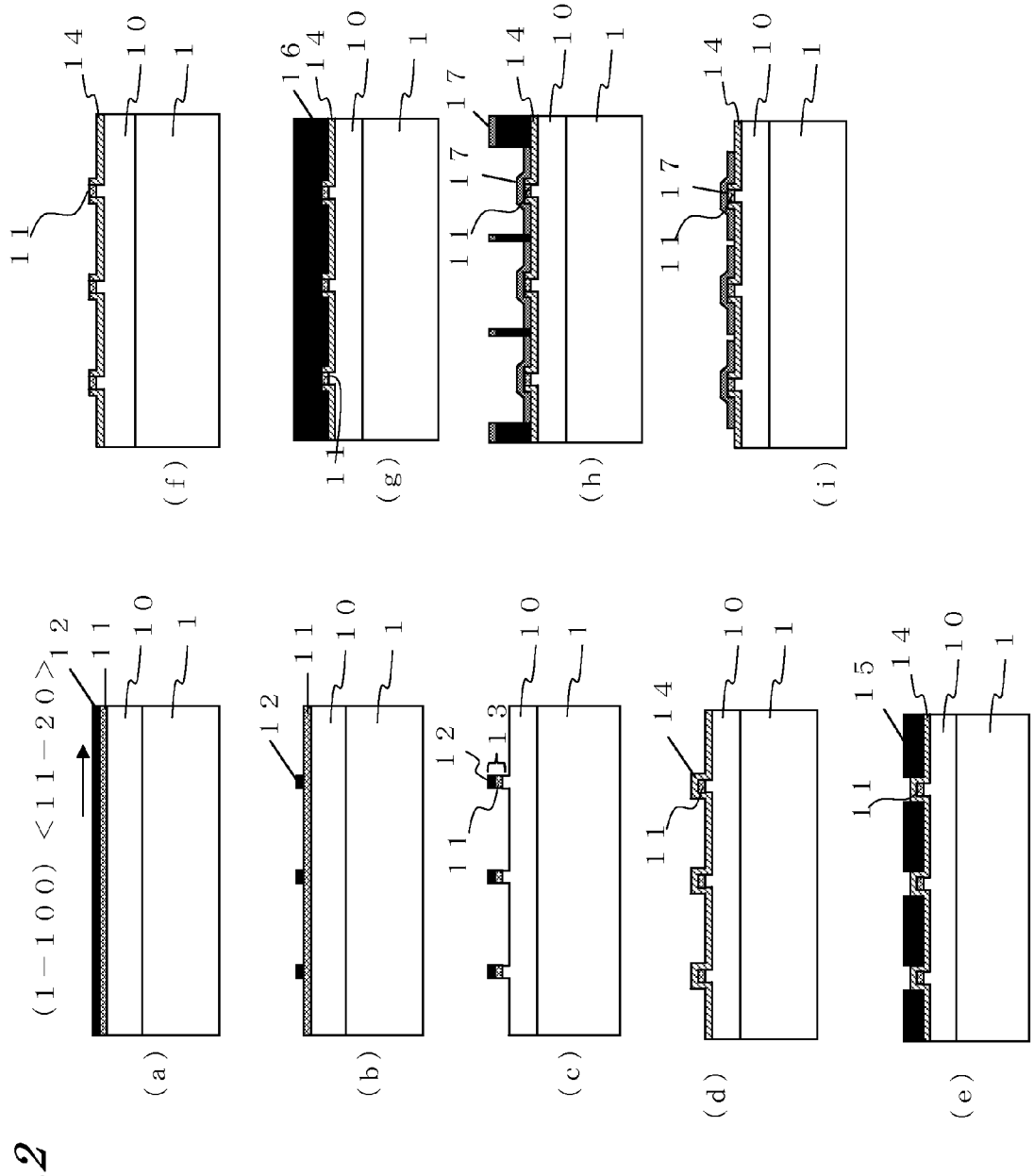
FIGS. 2(a) to (i) are schematic diagrams showing a processing process on the substrate main surface side according to Embodiment 1 of the present invention.

First, as shown in FIG. 2(a), a p-electrode 11 is formed on the upper surface of the semiconductor multilayer structure 10 by electron beam (EB) evaporation, and then a photoresist film 12 is applied thereon. The p-electrode 11 is composed of a single layer of metal or a multilayer structure, and, when subjected to a heat treatment as necessary, exhibits ohmic characteristics with respect to a p-type semiconductor layer. Next, an exposure and development of the photoresist film 12 is carried out through a photolithography step, thus forming a resist mask 12 as shown in FIG. 2(b). The resist mask 12 has a stripe pattern for forming optical waveguides.

Next, by performing dry etching by using argon (Ar) as an etching gas for the p-electrode 11 and chlorine ($Cl_2$) as an etching gas for the semiconductor multilayer structure 10, the portions of the p-electrode 11 and the semiconductor multilayer structure 10 which are not covered by the resist mask 12 are removed. By performing this dry etching until the etching depth into the semiconductor multilayer structure 10 is about 100 nm, a ridge-shaped optical waveguide 13 as shown in FIG. 2(c) is formed. It is assumed that the optical waveguide 13 extends in the <1-100> direction. Although the respective layers of the multilayer structure 10 are omitted from illustration in FIG. 2(c), on each protrusion composing the optical waveguide 13, the p-electrode 11 as well as the p-type contact layer 9 and the $Al_{0.05}Ga_{0.95}N$ cladding layer 8 of the multilayer structure 10 are disposed.

Next, the resist mask 12 is cleaned away with oxygen ashing and an organic solvent such as acetone, and thereafter an insulative film 14 is formed as shown in FIG. 2(d). The insulative film 14 is $SiO_2$ or the like which is produced by plasma CVD technique, for example, and is made of a material having a light confinement effect and voltage endurance. Next, after a resist film 15 is applied on the insulative film 14, the resist film 15 is removed as shown in FIG. 2(e), whereby portions of the insulative film 14 that are located above the optical waveguides 13 are exposed.

Next, dry etching is performed by using carbon tetrafluoride ($CF_4$) as an etching gas, thereby removing the exposed portions of the insulative film 14. Thereafter, as shown in FIG. 2(f), the resist film 15 is removed by an oxygen ashing and a cleaning that utilizes an organic solvent such as acetone. Furthermore, after a resist film 16 is applied as shown in FIG. 2(g), the resist film 16 is removed in regions containing the p-electrodes 11 as shown in FIG. 2(h), and a wiring electrode 17 is vapor-deposited by EB evaporation. Any wiring electrode 17 above the resist film 16 is lifted-off by dissolving the resist film 16 with an organic solvent such as acetone, whereby a semiconductor laser structure as shown in FIG. 2(i) is completed.

Next, with reference to FIGS. 3(a) to (h) and FIGS. 4(a) to (c), a processing process on the rear surface side of the GaN substrate 1 will be described.

Figure 3:
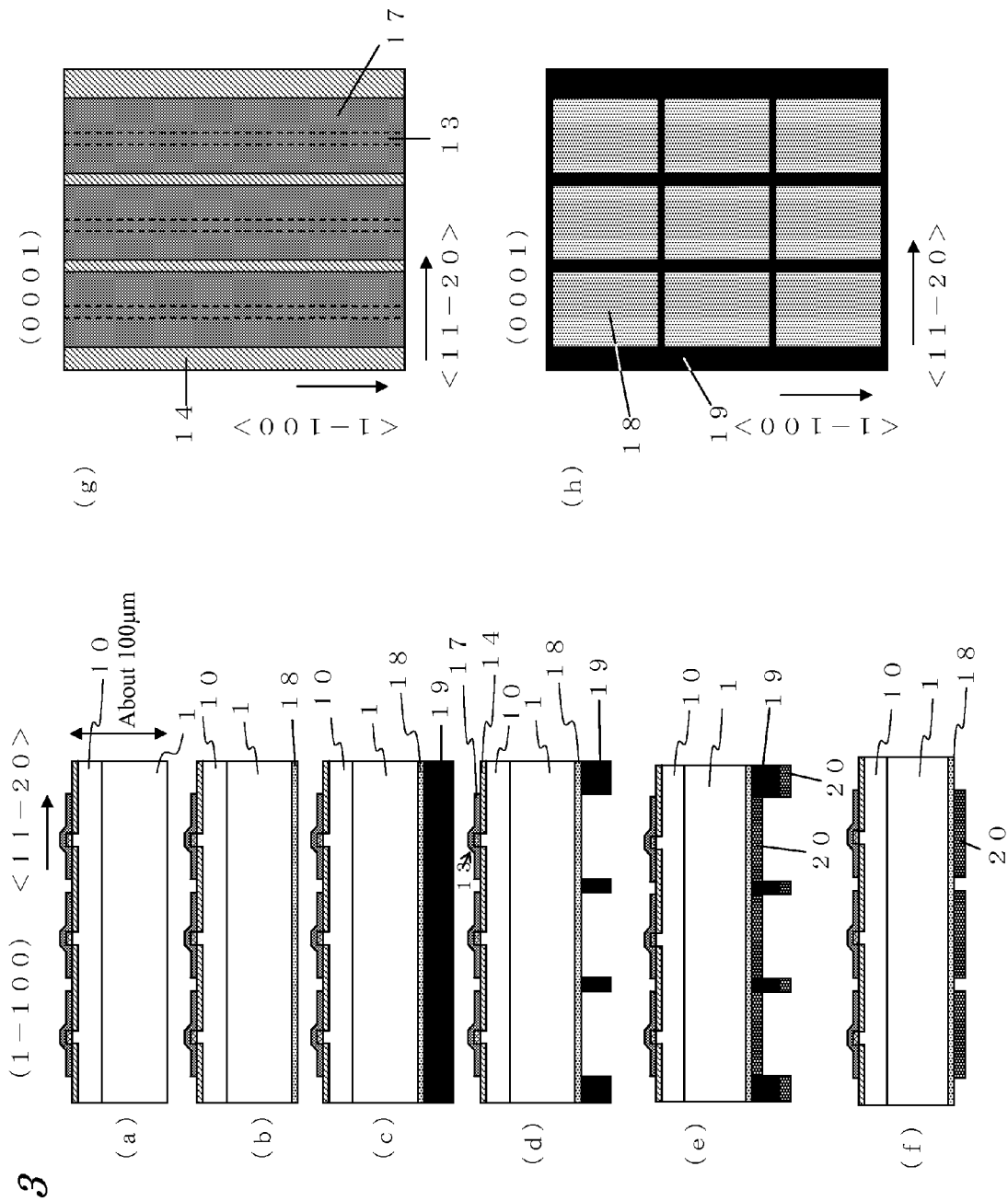
FIGS. 3(a) to (h) are schematic diagrams showing a processing process on the substrate rear surface side according to Embodiment 1 of the present invention.

First, wax is applied on the main surface side (i.e., the side on which the p-electrodes 11 are formed) of the GaN substrate 1, and the GaN substrate 1 is attached to a polishing jig (not shown) and polished on the rear surface side, whereby a total thickness of the semiconductor multilayer structure 10 and the GaN substrate 1 reaches about 100 μm, as shown in FIG. 3(a). The polished plane is mirror-finished by using a diamond slurry with a diameter of 0.5 μm, and the wax and the residual abrasive are cleaned away with an organic solvent such as acetone.

Furthermore, after the surface layer on the rear surface side of the GaN substrate 1 is removed by dry etching to create a clean surface, as shown in FIG. 3(b), a first n-electrode 18 is deposited on the entire rear surface of the GaN substrate 1 by EB evaporation. The GaN substrate 1 after polishing is mechanically fragile. Thus, it is possible to suppress wafer breaking in subsequent steps by thus covering the entire surface with first n-electrode 18 for reinforcement.

Furthermore, the resist film 19 is applied on the first n-electrode 18 as shown in FIG. 3(c), and by using an exposure apparatus (not shown) having a double side aligner, an exposure and development is performed so that a pattern as shown in FIG. 3(d) is formed. Herein, a shape as seen from the main surface side of the GaN substrate 1 is shown in FIG. 3(g), and a shape as seen from the rear surface side is shown in FIG. 3(h). As shown in FIG. 3(h), the resist film 19 has a lattice pattern, which is composed of linear portions extending along the <1-100> direction and linear portions extending along the <11-20> direction.

Figure 4:
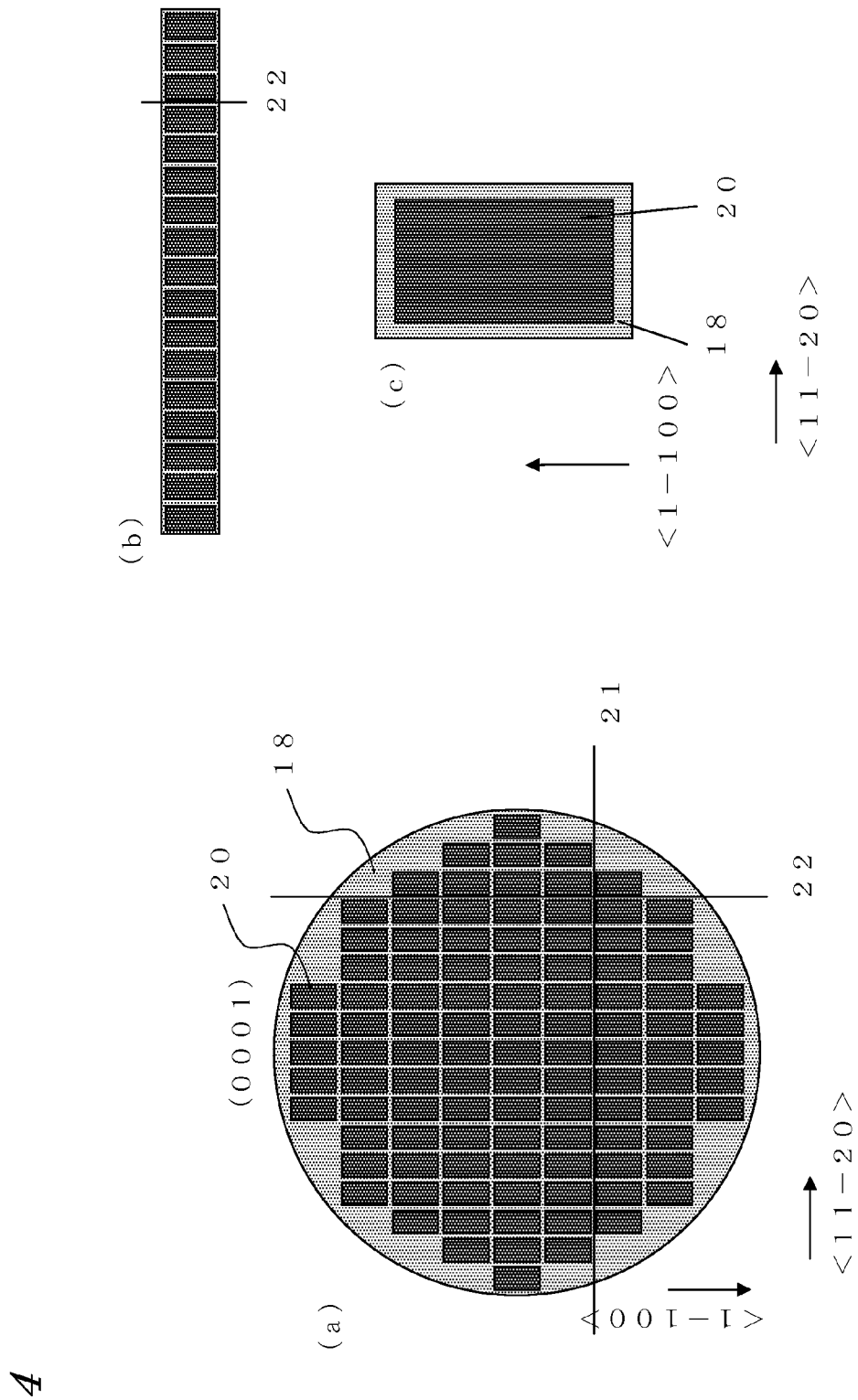
FIGS. 4(a) to (c) are schematic diagrams showing a device separation step according to Embodiment 1 of the present invention.

Next, as shown in FIG. 3(e), a second n-electrode 20 is deposited by EB evaporation. Thereafter, by dissolving the resist film 19 with an organic solvent such as acetone, any second n-electrode 20 above the resist film 19 is lifted-off, thereby forming the second n-electrodes 20 as shown in FIG. 3(f). When the wafer is viewed from the rear surface side, as shown in FIG. 4(a), the second n-electrodes 20 are patterned so that the first n-electrodes 18 are exposed in a lattice form.

It is not necessary that the second n-electrodes 20 are patterned so that the first n-electrodes 18 are exposed in a lattice form. It suffices if they are patterned so that the first n-electrodes 18 are exposed at least along the <11-20> direction. Since the (1-100) plane is a cavity end face, in a step of separating the devices, cleavage needs to occur along the <11-20> direction. Cleavage is facilitated if lines along the <11-20> direction are formed around the second n-electrodes 20.

The first n-electrodes 18 do not need to completely cover the entire rear surface of the GaN substrate 1, but may substantially cover the entire rear surface. In the present specification, "the entire rear surface being substantially covered" means 90% or more of the entire substrate (chip) rear surface being covered in a form as separated into each individual semiconductor light-emitting device.

It is preferable that the first n-electrodes 18 are made of at least one kind of metal selected from the group consisting of Ti, Pt, Mo, and Ni, or an alloy thereof; and it is preferable that the second n-electrodes are made of at least one kind of metal selected from the group consisting of Al, Au, Sn, and In having a higher ductility than that of the first n-electrodes, or an alloy thereof.

Since the first n-electrodes 18 are also deposited in positions to be split by cleavage, composing the first n-electrodes 18 from a metal having a low ductility serves to suppress peeling in a subsequent device separation step. Among the various physical parameters which are indices of ductility, it is desirable to use a metal with a tensile strength of 200 N/mm$^2$ or more for the first n-electrodes 18. Moreover, from the standpoint of contact resistance of the electrodes, it is desirable that each first n-electrode 18 forms an ohmic interface with n-type GaN.

Although Ti, Pt, Mo, and Ni will form an electrode which is ohmic with respect to n-type GaN, as for devices whose first n-electrode 18 is a Ti/Al multilayer structure, there are results indicative of an increased voltage after mounting as compared to after the end of the processing process. This is considered to be because metals that are Schottky with respect to n-type GaN, e.g., silver (Ag) and lead (Pb) contained in the solder material, have diffused into Ti and Al, which are of a nature that permits easy alloying. Ideally, it is preferable to adopt a structure in which the second n-electrode 20 is present between the solder material and the first n-electrode 18. However, it can be easily imagined that the solder material will seep up and come directly in contact with the first n-electrode 18 being exposed in the neighborhood of the four sides of the device. In other words, in consideration of the heating at a subsequent step, it is necessary to select a layer structure which is thermally stable and which can suppress diffusion of the solder material.

Thus, from the standpoint of ductility, contact resistance, and thermal stability, it is particularly preferable that the first n-electrode 18 has a layer construction such as Ti/Pt, Ti/Mo, Mo/Pt from the GaN substrate 1 side.

It is preferable that the second n-electrode 20 is made of a metal having a high ductility, with a tensile strength of 200 N/mm$^2$ or less. When the second n-electrode 20 has such ductility, it becomes possible to disperse the mechanical impact that is applied to the laser device in a subsequent soldering step, thus achieving stable mounting. By selecting the same material as the solder material Sn, Ag, In, copper (Cu), bismuth (Bi), etc., or selecting a combination therewith that will form an alloy and realize a lower melting point, the second n-electrode 20 will come to better terms and have a better wettability, which will be effective for dispersing mounting stress or obtaining an improved mounting reliability.

As for film thickness, at 30 nm or less, the first n-electrode 18 will have a less than adequate effect of improving the mechanical strength of the entire wafer and thus the chipping and cracking during the processing process will not be suppressed; at 300 nm or more, cleavage will become difficult; therefore, no less than 30 nm and no more than 300 nm is desirable. On the other hand, as for the second n-electrode 20, if its film thickness is 500 nm or less, the semiconductor crystal composing the device will be strained when weight is applied in the soldering step, thus deteriorating the reliability of the optical characteristics of the device. In order to reduce the stress that acts on the device during the soldering step, it is desirable that the second n-electrode 20 has a film thickness of 500 nm or more. Moreover, when the film thickness of the second n-electrode 20 is 500 nm or more, it is possible to suppress diffusion of metals that are Schottky with respect to n-type GaN, e.g., Ag or Pb from the solder material, which is sufficient also from the standpoint of heat-releasing ability.

An example of an n-electrode that realizes good electrical characteristics may be a construction in which a multilayer film having Ti=5 nm and Pt=100 nm from the GaN substrate 1 side is used as the first n-electrode 18 and a film having Au=1 μm is used as the second n-electrode 20.

Next, a heat treatment is applied to the n-electrodes as necessary. Although the optimum value of the heating temperature differs depending on the construction of the n-electrodes, the p-electrodes 11 on the main surface side are also heated simultaneously. Therefore, a temperature is selected such that the p-electrodes 11 will not be modified to result in a higher contact resistance with p-type GaN. Moreover, depending on the metals composing the first n-electrodes 18 and the second n-electrodes 20, there are combinations which will result in a high resistance upon alloying by heating; in that case, a heat treatment is performed after depositing the first n-electrodes 18 and no heat treatment is performed after a lift-off for the second n-electrodes 20.

Figure 5:
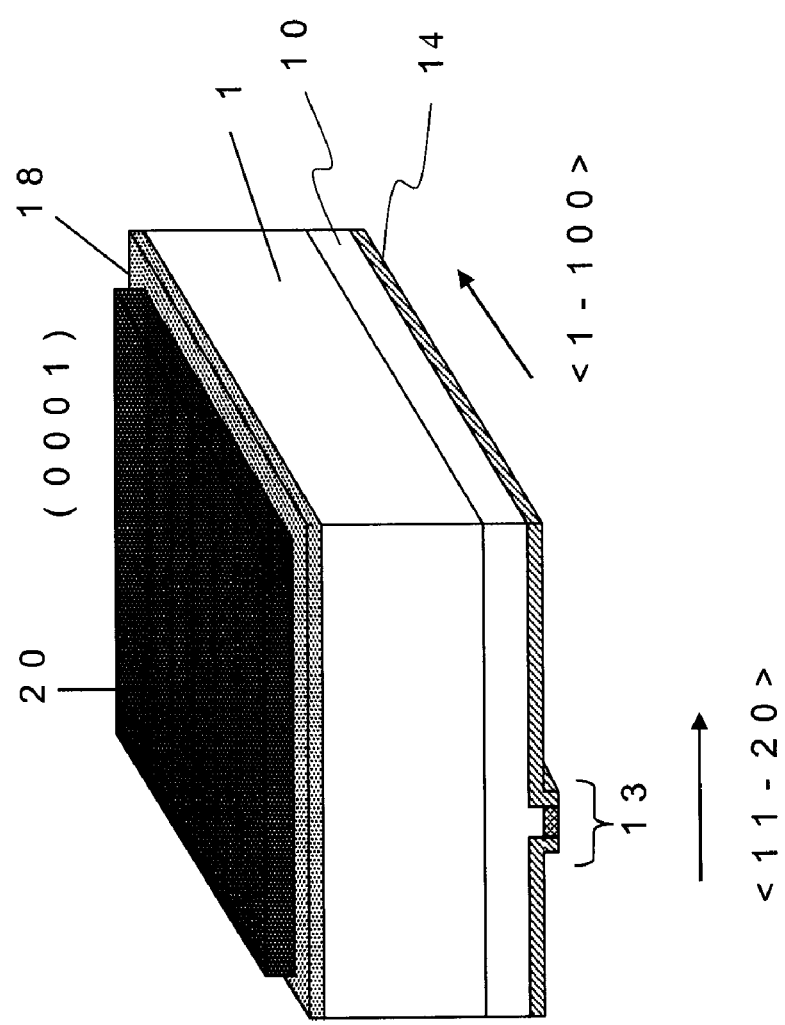
FIG. 5 is a schematic diagram showing a semiconductor laser device according to Embodiment 1 of the present invention.

Next, the device separation step will be described with reference to FIGS. 4(a) to (c). Device separation is carried out along the sides at which the first n-electrodes are exposed in a lattice form (cleavage directions). First, in order to perform a primary cleavage at cleavage positions 21, scratches extending along the <11-20> direction are formed with a diamond scriber (not shown) on the rear surface of the GaN substrate 1, and stress is applied along these scratches by using a blade, thereby creating a laser bar as shown in FIG. 4(b). A multi-layered dielectric film such as $SiO_x$ or $TiO_x$ is formed on both or either one of the cavity end faces of the resultant laser bar, and furthermore, in order to perform a secondary cleavage at cleavage positions 22 along the <1-100> direction, scratches are formed with a diamond scriber, and stress is applied by using a blade, whereby a semiconductor laser device as shown in FIG. 4(c) is separated. FIG. 5 shows a bird's-eye view where the n-electrode of the semiconductor laser device comes on top. As shown in FIG. 5, the entire rear surface of the GaN substrate 1 is substantially covered with the first n-electrode 18, and the second n-electrode 20 is disposed so that the periphery of the first n-electrode 18 is exposed. Although the second n-electrode 20 is shown to be formed so as to expose the neighborhood of the four sides of the first n-electrode 18 in FIG. 5, the second n-electrode 20 may be formed so as to expose at least a portion of the periphery of the first n-electrode 18. For example, the first n-electrode 18 may be exposed only along the two sides extending along the (1-100) plane, which are the cavity end faces of the semiconductor laser device.

Finally, via solder, the semiconductor laser device is disposed on the upper surface of a heat sink of aluminum nitride (AlN), so that the second n-electrode 20 is in contact therewith, and wiring is provided via wire bonding.

Herein, referring back to FIGS. 4(a) to (c), a desirable shape of the second n-electrode 20 will be described. When viewed from the (0001) plane side, a semiconductor laser device usually has a shape which is longer along the cavity direction <1-100> as shown in FIG. 4(c). Similarly, the second n-electrode 20 desirably has a shape which is longer along the <1-100> direction; for example, the second n-electrode 20 is a rectangle when viewed from the (0001) plane side, as shown in FIG. 4(c). The shorter sides of the second n-electrode 20 are arranged so as to be perpendicular to the optical waveguide 13 and on one line along the crystal orientation <11-20> of the GaN substrate 1 and the semiconductor multilayer structure 10. Even in the case where the primary cleavage is performed from the rear surface of the GaN substrate 1, they can be utilized as markers for determining desired cleavage positions, thus making it possible to create a smooth light-outgoing end face with a good precision. Moreover, the second n-electrodes 20 are disposed so that their period along the <11-20> direction is equal to the end face length in the final form of the laser device and that their period along the <1-100> direction is equal to the cavity length.

The second n-electrode 20 will have a smaller contact resistance as its contacting area with the first n-electrode 18 increases, and as its contacting area with the heat sink 23 increases, the heat which is generated during a laser operation will more readily dissipate. Therefore, in order to suppress deterioration of the semiconductor laser device due to heat and to ensure long life, the area of the second n-electrode 20 as viewed from the (0001) plane should be as large as possible. On the other hand, the distance between adjoining second n-electrodes 20 only needs to be so large that no obstruction occurs when a diamond cutter or blade used for device separation comes in contact with the first n-electrodes 18; specifically, a distance of about 20 µm will be sufficient.

Therefore, in consideration of the heat-releasing ability and the cleavage step, it is desirable that the distance between second n-electrodes is about 20 to 90 µm. As for the length along the <1-100> direction, since a current is likely to concentrate immediately under the optical waveguide 13 and generate heat, it is necessary to provide as broad covering with the second n-electrode 20 as possible for obtaining an improved heat-releasing ability. Therefore, in the final form of the laser device, it is desirable that the region in which the first n-electrode 18 is exposed without being covered by the second n-electrode 20 is no less than 5 µm and no more than 50 µm from each primary cleavage end face along the cavity length direction. Since temperature is particularly likely to increase in the light-outgoing region on a primary cleavage end face, in the case where 50 µm or more of the first n-electrode 18 is exposed from the primary cleavage end face along the cavity length direction, less than an adequate release of heat from the light-outgoing region will occur. Thus, the emission efficiency will be degraded, and if the laser oscillation is continued, a problem will occur in that the semiconductor crystal may be melted until the operation is halted. Similarly along the <11-20> direction, too, an improved heat-releasing ability can be expected by approximating the size of the final device form as closely as possible. Moreover, usually an error of about ±5 µm occurs in the cleavage step. Therefore, assuming that the distance between second n-electrodes before cleavage is 20 µm or more, the exposed region of the first n-electrode 18 will be 5 µm or more in the laser device after cleavage.

By using the above-described method, without any peeling of the n-electrode or problems due to mounting, etc., laser devices having smooth cavity end faces were obtained with a high yield, and at room temperature, continuous oscillation was confirmed at an operating current 60 mA, with a threshold current of 30 mA and an output power of 50 mW, and a lifespan of 1000 hours or more was exhibited.

Comparative Example 1

With a method similar to Embodiment 1, a semiconductor laser structure is fabricated on the main surface of the GaN substrate 1, and polishing is conducted from the rear surface side until the total thickness of the semiconductor multilayer structure 10 and the GaN substrate 1 reaches about 100 µm. As the n-electrode, Ti=5 nm, Pt=100 nm, and Au=1 µm are deposited on the entire rear surface from the GaN substrate 1 side. The n-electrode is not patterned as in Embodiment 1, but has a uniform and flat shape.

Since the n-electrode is uniformly deposited on the entire rear surface, it is not possible to confirm the p-side structure by looking from the rear surface side, making it difficult to determine the cleavage positions. Therefore, even if scribe marks are formed on the rear surface side by using a scribing device (not shown), a problem is likely to occur in that the direction of the scribe marks may be deviated from the <11-20> direction, thus resulting in a lower emission efficiency of the device because of inability to obtain a smooth (1-100) plane.

As a method of performing primary cleavage by forming scribe marks on the main surface side, as in the method disclosed in Patent Document 3, scribe marks which are several mm long may be formed in a semiconductor multilayer region at the main surface side, and a blade may be used to apply stress. However, in this method, the optical waveguide of the device which is disposed in each several mm-long region where a scribe mark is formed will be destroyed, thus failing to operate as a laser device; therefore, the yield will be low. Moreover, even in regions which are not directly destroyed by scribe marks, damage is likely to occur in the semiconductor multilayer structure, thus resulting in a lower emission efficiency.

Comparative Example 2

With a method similar to Embodiment 1, a semiconductor laser structure is fabricated on the main surface of the GaN substrate 1, and polishing is conducted from the rear surface side until the total thickness of the semiconductor multilayer structure 10 and the GaN substrate 1 reaches about 100 µm. Instead of depositing a first n-electrode on the entire rear surface as in Embodiment 1, a resist film is applied on the entire rear surface, and a patterning is performed by photolithography technique so as to open positions at which to form n-electrodes, whereby an aperture pattern is formed on the substrate rear surface. Now, in order to make it easy to identify the crystal plane at which to perform cleavage (i.e., the M-plane (1-100) herein), sides that are perpendicular to the optical waveguide extending along the <1-100> direction are provided at the shorter sides of the aperture pattern. Thereafter, n-electrodes are deposited by EB evaporation, and the resist film is dissolved with an organic solvent such as acetone, thus lifting-off any n-electrode above the resist film.

In a wafer which has been polished from the substrate rear side, the outer periphery of the wafer is thinner than the central portion, and has chips and cracks therein. Therefore, in a patterning step by photolithography technique, due to an impact when the wafer is placed in close contact against a reticle, the wafer is likely to be disjointed beginning from a chip or crack.

Therefore, tentatively, a wafer's outer periphery having chips and cracks were cut off after polishing, and the wafer was cut into a square of about 20 mm×20 mm and then patterned, but the wafer was also disjointed in this case. On the other hand, when the wafer was cut into a square of about 10 mm×10 mm, the wafer was not disjointed. A polished wafer is entirely thin and is weak against mechanical impacts, and also the entire wafer is expected to be warped. Thus, presumably, the wafer will be disjointed regardless of presence or absence of chips and cracks in the outer periphery, unless the wafer is cut out so small that the influence of warp is negligible. However, in this method of cutting out a smaller shape out of the wafer by cutting off its outer periphery before patterning, a long time will be required for the step of cutting-out and patterning, and the region of the wafer that is available for device fabrication will be reduced, thus presenting cost disadvantages in the case of mass production.

Comparative Example 3

Figure 6:
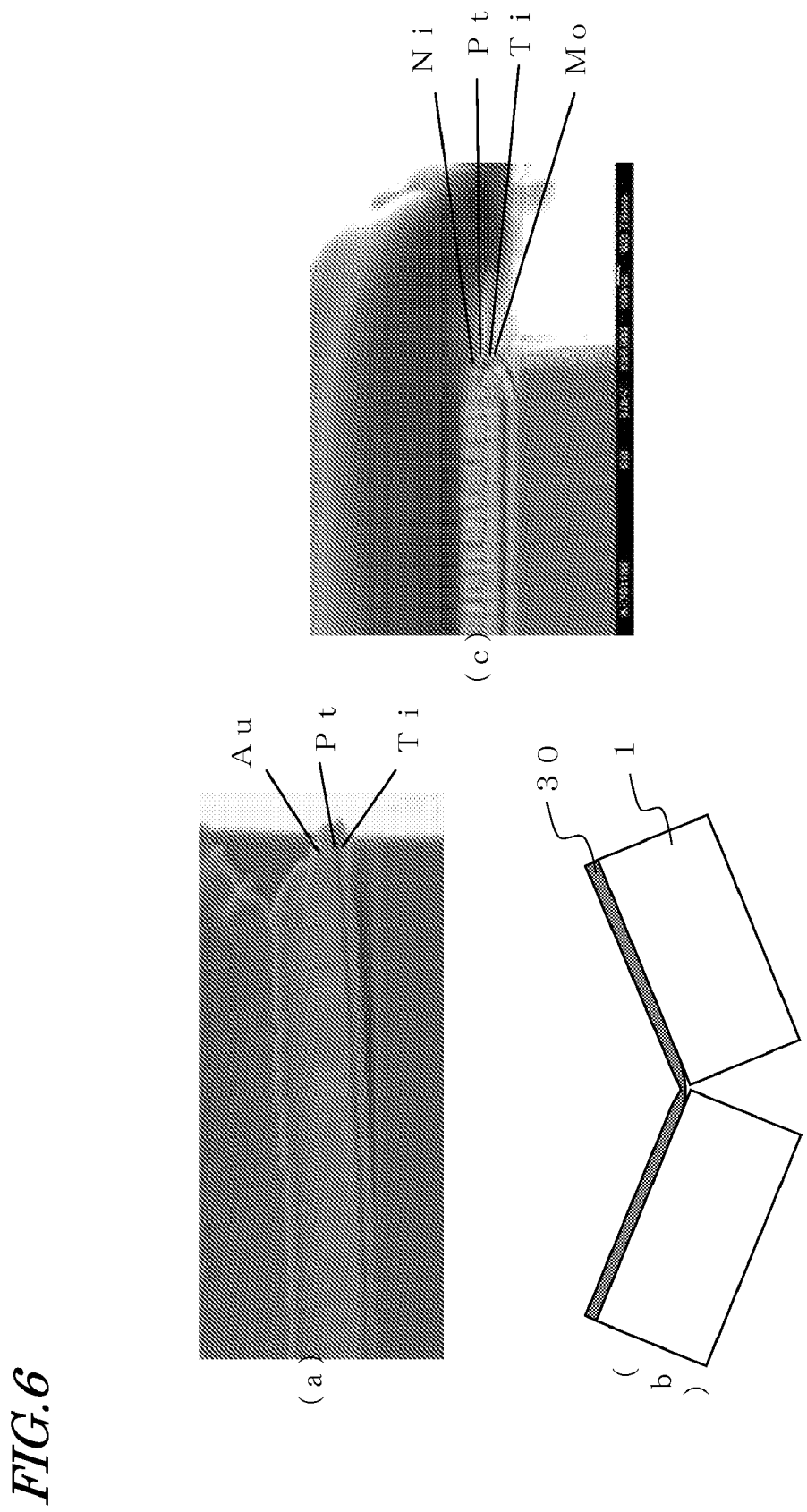
FIGS. 6(a) to (c) are diagrams showing states of cleavage planes according to Comparative Example 3 and according to Embodiment 1 of the present invention.

Au was selected as an example of a highly ductile metal. With respect to the case where a multilayer structure of plural metals including Au was deposited on the entire wafer rear surface and the case where a multilayer structure of plural metals lacking in ductility relative to Au was deposited on the entire wafer rear surface, the device was separated by edge scribing and stress application using a blade, and the shape of the neighborhood of a cleavage plane was confirmed. Results of cutting out a face which is perpendicular to the cleavage plane with an FIB (focused ion beam) and observing the shape with an SEM (scanning electron microscope) will be described with reference to FIG. 6.

FIG. 6(a) shows a case where Ti/Pt/Au are deposited from the GaN substrate 1 side. With cleavage of the semiconductor layer, the n-electrode is peeled by about 3 µm from a (1-100) end face. This is considered to be because, when stress is applied with a blade as shown in the schematic diagram of FIG. 6(b), the GaN substrate 1 having cleavability is broken at the M-plane (1-100), but the metal layer 30 containing highly-ductile Au is slightly stretched and then disjointed.

FIG. 6(c) shows a case where a multilayer structure of metals not including Au and having a lower ductility than that of Au was deposited on the wafer rear surface, where the first n-electrode 18 was deposited in the order of Mo/Ti/Pt/Ni from the GaN substrate 1 side. No metal peeling was confirmed like in the case where Au was included. Thus, it is considered that stretching of the metal layer due to stress application did not occur.

Note that, in FIG. 6(c), a region where the semiconductor layer is not covered by any metal layer exists about 200 nm from the end face. This is ascribable to a difference in plasticity between the semiconductor layer and the metal layer, and also a slight deviation in the position and direction in which the blade strikes. At the most, such positional offset between the semiconductor layer and the metal layer at the end face can be 500 nm or less, and will not affect the device characteristics. In the present specification, the expression that "the first n-electrode substantially covers the entire main surface of the GaN substrate" encompasses the case where the first n-electrode has a deviation of about 500 nm and is not completely covering the entire substrate rear surface due to errors such as this positional offset.

Embodiment 2

With a method similar to Embodiment 1, the GaN substrate 1 having the semiconductor multilayer structure 10 formed thereon is subjected to a semiconductor laser structure processing process, and the rear surface side of the wafer is polished. After a cleaning with an organic solvent, the surface layer on the rear surface side of the GaN substrate 1 is removed by dry etching to create a clean surface, and the first n-electrode 18 and the second n-electrode 20 are deposited by EB evaporation in succession on the entire rear surface of the GaN substrate 1, as shown in FIG. 7(a).

Figure 7:
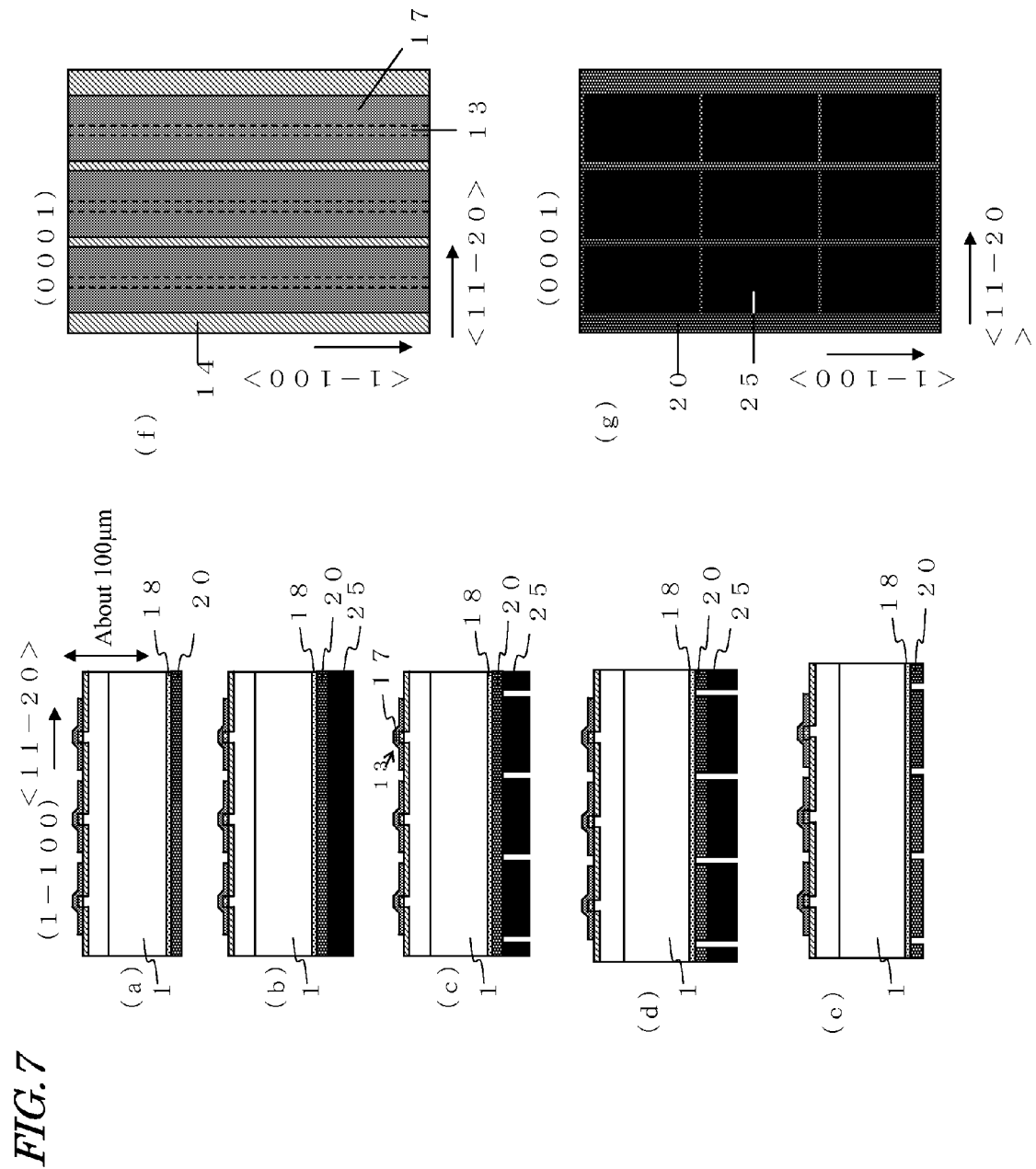
FIGS. 7(a) to (g) are schematic diagrams showing a processing process on the substrate rear surface side according to Embodiment 2 of the present invention.

Furthermore, as shown in FIG. 7(b), after a resist film 25 is applied on the second n-electrode 20, a pattern as shown in FIG. 7(c) is formed on the resist film 25 by using an exposure apparatus (not shown) having a double side aligner. Herein, a shape as seen from the main surface of the GaN substrate 1 is shown in FIG. 7(f), and a shape as seen from the rear surface side is shown in FIG. 7(g). In order to make it easy to identify the crystal plane at which to perform cleave (i.e., the M-plane (1-100) herein) in the step of separating the devices, the resist film 25 is formed so as to have sides that are perpendicular to the optical waveguide 13 extending along the <1-100> direction. Next, by performing an etching as shown in FIG. 7(d), the regions of the second n-electrode 20 not covered with the resist film 25 are removed. Thereafter, the resist film 25 is removed as shown in FIG. 7(e).

When removing the second n-electrode 20 by wet etching, the surface of the semiconductor laser structure is covered with a resist or film for protection, in order to prevent the semiconductor laser structure on the main surface side from being corroded or destroyed. Moreover, an etchant is selected which only etches the second n-electrode 20 but does not react with the resist or film covering the surface of the semiconductor laser structure. For example, in the case where the second n-electrode 20 is Au, an aqueous solution of potassium iodide (KI) and iodine ($I_2$) may be used to selectively etch away Au alone. In the case where a metal having a high ionizing tendency is used as the second n-electrode 20, e.g., Al or Ni, it is possible to selectively remove Ni alone by using etchants such as an aqueous solution of nitric acid, phosphoric acid, and acetic acid. Also with ion milling or the like which lacks in selectivity, it is possible to remove the second n-electrode 20 not being covered by the resist. Although the first n-electrode 18 may be slightly removed, this is still applicable because the device characteristics will not be affected. The steps after the device separation step are similar to those in Embodiment 1.

Although the second n-electrode 20 is deposited by EB evaporation in the present embodiment, it can also be deposited by plating or the like. By depositing it by plating or the like, the second n-electrode 20 can be made into a thicker film than in the case of EB evaporation, thus further improving the heat-releasing ability.

Embodiment 3

Figure 8:
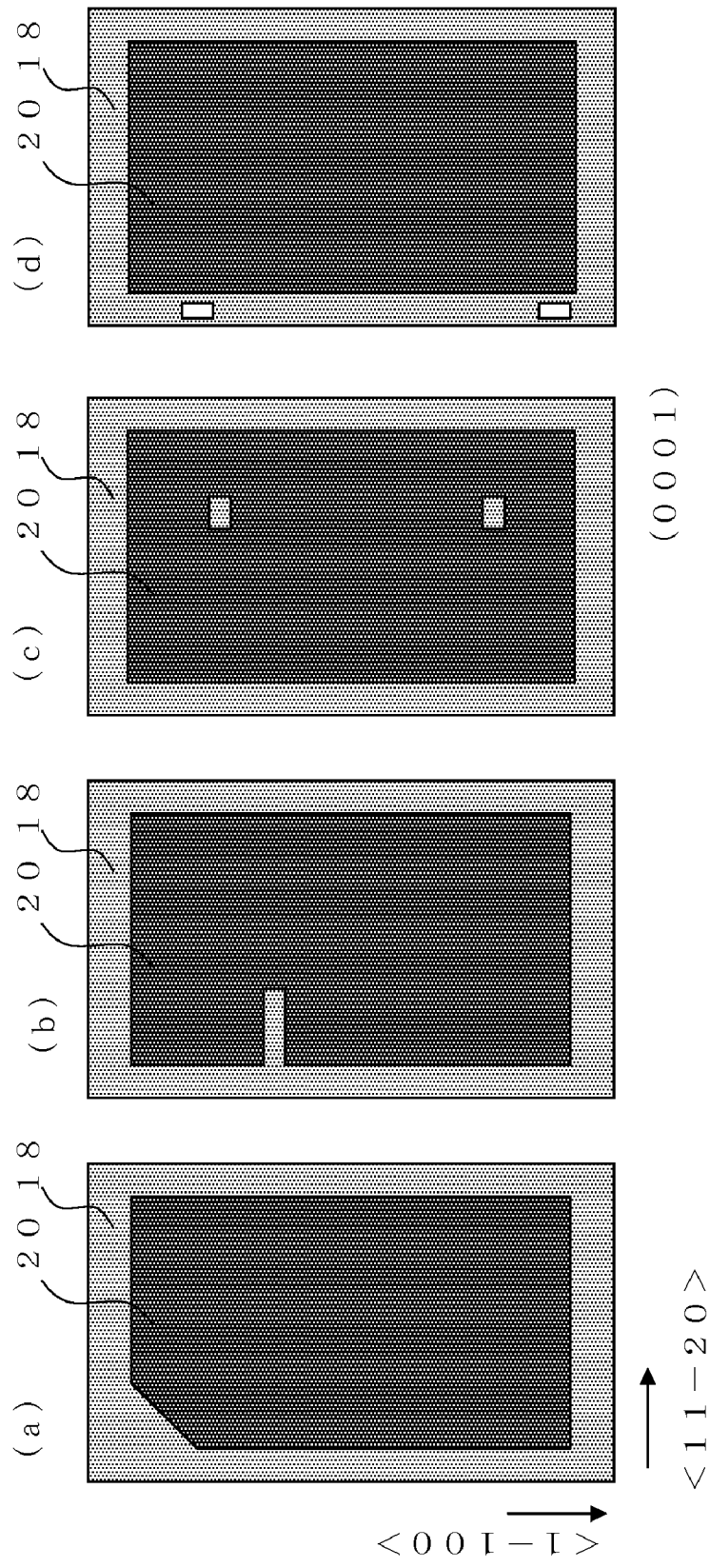
FIG. 8 is a schematic diagram showing shapes of a second n-electrode according to Embodiment 3 of the present invention.

A semiconductor light-emitting device is fabricated with the procedure described in Embodiment 1. Herein, the shape of the second n-electrode 20 may be any shape which allows the periphery of the first n-electrode 18 to be exposed and which has a side perpendicular to the optical waveguide 13 extending along the <1-100> direction, and is not limited to a substantial rectangle. For example, as shown in FIGS. 8(a) and (b), it may be a shape lacking one corner of a substantial rectangle; or there may be regions exposing the first n-electrode other than the neighborhood of the four sides, as shown in FIG. 8(c). Thus, when regions exposing the first n-electrode at predetermined positions are provided, they can be utilized as markers in a subsequent mounting step.

Moreover, the first n-electrode 18 does not need to cover the entire rear surface of the GaN substrate 1. For example, as shown in FIG. 8(d), portions thereof may be missing. Moreover, due to misalignment or a difference in ductility between the GaN substrate 1 and the first n-electrode 18, a part of the edges of the GaN substrate 1 may not be covered by the first n-electrode 18. However, the first n-electrode 18 needs to be formed in a broader region than the second n-electrode 20, and preferably covers 90% or more of the substrate rear surface, for example.

Hereinafter, results of observing the neighborhood of the first n-electrode 18 and the second n-electrode 20 with an SEM after mounting the semiconductor laser devices of Embodiments 1 to 3 will be described. In the semiconductor laser devices used for this measurement, Ti with a thickness of 5 nm and Pt with a thickness of 100 nm are formed from the GaN substrate 1 side as the first n-electrode 18, and Au with a thickness of 1 μm is formed as the second n-electrode 20. Whereas the first n-electrode 18 is formed almost on the entire rear surface of the GaN substrate 1, the second n-electrode 18 is patterned so that an edge portion of the first n-electrode 18 is exposed. In other words, on the rear surface of each semiconductor laser device, the first n-electrode 18 is exposed with a width of 25 μm at an edge portion, and the second n-electrode 20 is disposed in the central portion. After such an n-electrode was allowed to adhere to a heat sink by using solder, an observation was performed. AuSn was used as the solder material in the mounting. FIG. 9(a) is an SEM photograph of the region (edge portion) where only the first n-electrode 18 is formed, whereas FIG. 9(b) is an SEM photograph of the region (central portion) where the first n-electrode 18 and the second n-electrode 20 are stacked. In FIGS. 9(a) and (b), the rear surface of the GaN substrate 1 of the semiconductor laser device adheres to the heat sink 23 via solder 24. Note that the outer shapes of the first n-electrode 18 and the second n-electrode 20 do not appear in the photographs of FIGS. 9(a) and (b). This is considered to be because the first n-electrode 18 has a very small thickness and because the second n-electrode 20 and the solder 24 have been deformed due to heat at the time of mounting. In FIG. 9(a), some voids (regions in dense colors) are present here and there between the semiconductor laser device and the solder 24. On the other hand, in FIG. 9(b), hardly any voids are observed between the GaN substrate 1 and the heat sink 23. From these results, even after mounting, it is possible to analyze existence of regions where the second electrode 20 was not formed, by observing the relative amounts of voids.

Figure 10:
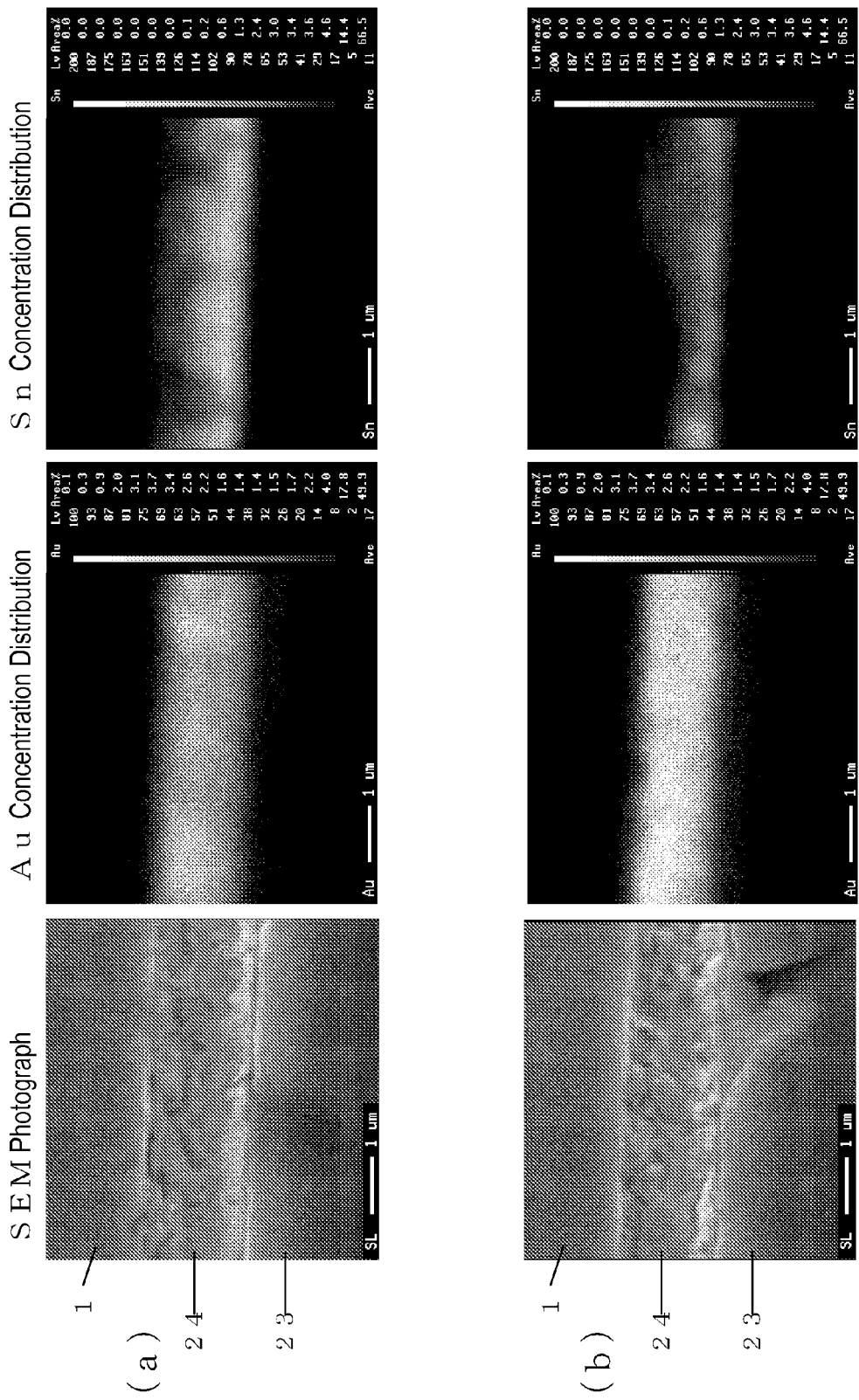
FIGS. 10(a) and (b) are results of a concentration mapping analysis of the neighborhood of an n-electrode after the semiconductor light-emitting devices of Embodiments 1 to 3 are mounted.

Furthermore, results of a concentration mapping analysis for Au and Sn will be described. FIG. 10(a) shows a result of observing a region (edge portion) where only the first n-electrode 18 is formed, whereas FIG. 10(b) shows a result of observing a region (central portion) where the first n-electrode 18 and the second n-electrode 20 are stacked. FIGS. 10(a) and (b) each show three photographs, from the left as facing the figure: an SEM photograph, an Au concentration distribution, and an Sn concentration distribution. When the Au concentration distribution and the Sn concentration are compared, it can be seen that the relative Au concentration against the Sn concentration is entirely higher in the region shown in FIG. 10(b) than in the region shown in FIG. 10(a). This difference in concentration is because the Au second n-electrode 20 is not formed in the region shown in FIG. 10(a), but is formed in the region shown in FIG. 10(b). Moreover, Au is almost uniformly distributed in the region shown in FIG. 10(b), and this result indicates that the Au of the second n-electrode 20 and the AuSn of the solder material have composed an alloy. Thus, in the case where a material which is likely to form an alloy with the solder material is used as the second n-electrode 20, peeling from the heat sink 23 and voltage problems can be avoided.

As described above, according to the present invention, since the entire substrate rear surface is covered with the first n-electrodes, the mechanical strength of the entire wafer is improved. As a result, chipping and cracking are unlikely to occur in subsequent steps, and it is possible to fabricate nitride semiconductor devices with a high yield. Since the first n-electrodes are deposited on the entire substrate rear surface, it becomes possible to reduce the contact resistance between the semiconductor substrate and the n-electrodes.

By providing second n-electrodes which are patterned corresponding to the respective devices, it becomes possible to perform cleavage by referring to the second n-electrodes. This makes it possible to avoid deviation of the cleavage direction from the crystal orientation. As a result, cracking and destruction of the multilayer structure on the substrate main surface side can be prevented.

Furthermore, when mounting the semiconductor light-emitting device to a heat sink, by allowing solder to come in contact with not only the second n-electrode but also the first n-electrode exposed in its periphery, the contacting area of solder is broadened. Therefore, the heat generated when the device is driven can be easily dissipated. In a semiconductor light-emitting device which is desired to have a high output power, broadening the contacting area in this manner to improve the heat-releasing ability is expected to prolong the life of the device.

Furthermore, by using soft metals such as Al, Au, Sn, and In for the second n-electrode, it becomes possible to alleviate the pressure when allowing the semiconductor device to adhere to a heat sink, whereby crystal strain and cracking can be suppressed.

Moreover, regardless of whether the scratches to serve as beginning points of cleavage are formed on the rear side or the main surface side of the substrate, or whether the stress for effecting the cleavage is applied on the rear side or the main surface side of the substrate, by using only low-ductility metals such as Ti, Pt, Mo, and Ni as the first n-electrodes at the positions of cleavage splitting, it is ensured that peeling and breaking of the electrodes are unlikely to occur, thereby suppressing problems such as the barrier metal contacting with the semiconductor layer and leakage.

Other Embodiments

Although the semiconductor light-emitting devices of Embodiments 1 to 3 are made of nitride semiconductors, the present invention is also applicable to semiconductor light-emitting devices which are made of silicon carbide.

Moreover, although the semiconductor light-emitting devices of Embodiments 1 to 3 are semiconductor laser devices, the present invention also provides similar effects for LEDs.

INDUSTRIAL APPLICABILITY

A semiconductor light-emitting device according to the present invention is broadly applicable as a light source for various devices, such as optical disk recording apparatuses, illumination devices, and the like.

The invention claimed is:

1. A semiconductor light-emitting device comprising:
 a semiconductor substrate containing an n-type impurity and being made of silicon carbide or a nitride semiconductor;
 an n-type semiconductor layer provided on a main surface of the semiconductor substrate;
 an active layer provided on the n-type semiconductor layer;
 a p-type semiconductor layer provided on the active layer;
 a p-electrode in contact with the p-type semiconductor layer; and
 an n-electrode in contact with a surface of the semiconductor substrate opposite from the main surface, wherein,
 the n-electrode includes a first n-electrode which covers the entire surface of the semiconductor substrate opposite from the main surface and a second n-electrode provided on the first n-electrode so as to expose at least a portion of a periphery of the first n-electrode.

2. The semiconductor light-emitting device of claim 1, wherein the first n-electrode comprises a material having a lower ductility than that of the second n-electrode.

3. The semiconductor light-emitting device of claim 1, wherein the first n-electrode comprises at least one kind of metal selected from the group consisting of titanium (Ti), platinum (Pt), molybdenum (Mo), and nickel (Ni) or an alloy thereof, and the second n-electrode comprises at least one kind of metal selected from the group consisting of aluminum (Al), gold (Au), tin (Sn), indium (In), and nickel (Ni) or an alloy thereof.

4. The semiconductor light-emitting device of claim 1, wherein the semiconductor substrate comprises gallium nitride.

* * * * *